(12) United States Patent
Wilkinson et al.

(10) Patent No.: US 7,261,795 B2
(45) Date of Patent: Aug. 28, 2007

(54) METHOD FOR ENCAPSULATION OF LIGHT EMITTING POLYMER DEVICES

(75) Inventors: Matthew C. Wilkinson, Scotts Valley, CA (US); Susan A. Carter, Santa Cruz, CA (US); Melissa Kreger, Santa Cruz, CA (US)

(73) Assignee: Add-Vision, Inc., Scotts Valley, CA (US)

( * ) Notice: Subject to any disclaimer, the term of this patent is extended or adjusted under 35 U.S.C. 154(b) by 359 days.

(21) Appl. No.: 10/745,953

(22) Filed: Dec. 24, 2003

(65) Prior Publication Data

US 2004/0187999 A1    Sep. 30, 2004

Related U.S. Application Data

(60) Provisional application No. 60/436,691, filed on Dec. 27, 2002.

(51) Int. Cl.
*B29C 65/00* (2006.01)
(52) U.S. Cl. .................. 156/298; 156/285; 156/272.2; 313/512; 313/483
(58) Field of Classification Search ................. 156/298
See application file for complete search history.

(56) References Cited

U.S. PATENT DOCUMENTS

| | | | |
|---|---|---|---|
| 5,734,225 A | | 3/1998 | Biebuyck et al. |
| 6,049,167 A | * | 4/2000 | Onitsuka et al. ............ 313/512 |
| 6,118,426 A | * | 9/2000 | Albert et al. ............... 345/107 |
| 6,198,217 B1 | * | 3/2001 | Suzuki et al. ............... 313/504 |
| 6,429,584 B2 | * | 8/2002 | Kubota ........................ 313/504 |
| 6,573,652 B1 | * | 6/2003 | Graff et al. .................. 313/512 |

FOREIGN PATENT DOCUMENTS

| | | |
|---|---|---|
| EP | 0 751 699 | 1/1997 |
| RU | 1123773 | 12/1998 |
| WO | WO 01/05205 | 1/2001 |

* cited by examiner

*Primary Examiner*—Jeff H. Aftergut
*Assistant Examiner*—Daniel McNally
(74) *Attorney, Agent, or Firm*—Pillsbury Winthrop Shaw Pittman LLP

(57) ABSTRACT

A cost effective manufacturing process encapsulates a light emitting polymer (LEP) device between two flexible sheet materials, where one sheet may act as the substrate for the LEP device and the other sheet may act as a cover for the LEP device, and at least one of the sheets is transparent. Both encapsulating sheets and, as required, an adhesive system binding the sheets together provide sufficient environmental barriers with low moisture vapor transmission rates (MVTR) and oxygen transmission rates (OTR). The encapsulating sheets may, for example, be laminated together, sandwiching the LEP device in a vacuum, or oxygen/moisture free, and inert gas environment. Prior to encapsulation the LEP device may be heated and placed in a vacuum to remove moisture, air and residual solvents. The process may also be designed for roll to roll, sometimes called web based processing, where the LEP device and/or encapsulating sheet material are in a continuous roll format with an adhesive with low air permittivity, such as some UV or thermal curable epoxies, or a melt lamination process used to attach the encapsulating sheets. For LEP devices with short lifetime requirements, the encapsulating material may be in liquid form and applied by spraying, dipping, doctor balding, and the like, or printing, such as screen printing, roller coating or lithographic application in single or multiple layers. Such material may also contain desiccants to further remove water and/or oxygen.

36 Claims, 5 Drawing Sheets

METHOD FOR ENCAPSULATION OF LIGHT EMITTING POLYMER DEVICES

CROSS-REFERENCE TO RELATED APPLICATIONS

This application claims the benefit of priority under 35 U.S.C. § 119(e) from U.S. Provisional Application No. 60/436,691 to Wilkinson et al., filed Dec. 27, 2002 and entitled "Process for Encapsulation of Light Emitting Polymer Devices," which is incorporated herein by reference in its entirety and for all purposes.

BACKGROUND OF THE INVENTION

1. Field of the Invention

This invention relates to electroluminescent devices, and more particularly to the fabrication of light emitting polymer devices. Specifically, this invention describes a unique, low cost, encapsulation process that provides a barrier for preventing ambient moisture and oxygen in light emitting polymer devices with air-stable electrodes (cathodes).

2. Description of the Related Art

Typical light emitting polymer (LEP) devices have been under development for flat panel and other display applications for many years. There are other patents that teach how different LEP device layers enable the efficient production of electroluminescent light. For example, in U.S. Pat. No. 5,399,502, Friend et al. teach a method of manufacturing electroluminescent devices, and in U.S. Pat. No. 5,869,350, Heeger et al. teach the fabrication of visible light emitting diodes soluble semiconducting polymers. Including these typical device design, all LEP devices are currently limited in their use due to poor environmental stability. The ingress of water and oxygen into the device creates catastrophic failure mechanisms (e.g., photo-oxidation, electrochemical reactions, metal migration, delamination of the device, etc.) resulting in dark spots, shorting and other failures of the device. These problems, and others, are compounded for LEP devices made on thin flexible plastic substrates because these substrates typically provide little protection against oxygen and moisture ingress. For these reasons all LEP devices of today must be encapsulated between top and bottom barrier layers of some type.

There have been several approaches to solving the problems with LEP devices made on thin flexible plastic substrates. One common technique is to fabricate the LEP device on glass then cover the top of the device by attaching a metal can or a second glass plate with adhesive. The glass and metal of this typical design provides a near hermetic seal. The problem with this technique is that the finished display is ridged, heavy, bulky, fragile and expensive. For LEP devices made on plastic substrates, new technologies have been developed to create transparent, flexible barriers. One example is a series of alternating thin layers of polymer and ceramic materials to create a thin, transparent oxygen and moisture barrier layer that can be applied directly to the device or on to any plastic substrate. Several examples of these polymer-ceramic layered LEP devices can be found in U.S. Pat. No. 6,268,695 to Affinito, U.S. Pat. No. 6,146,225 Sheats et al., U.S. Pat. No. 5,734,225 to Biebuyck et al. and U.S. Pat. No. 6,635,989 to Nilsson et al., for example.

Typical LEP devices require low work function metal cathodes for efficient charge injection into the light emitting polymer layer. The low work function metal cathodes, typically Calcium or Lithium, are not air-stable and quickly oxidize in the presence oxygen. These low work function metals require that the LEP devices never come into contact with air before or during fabrication process, including the encapsulation process. Thus, this requires that the cathodes be deposited in an inert gas environment and then that the LEP device be continually maintained in that inert gas environment until encapsulation is complete. This makes manufacturing difficult, time consuming and expensive.

A solution to this problem of maintaining an inert environment from fabrication through encapsulation has been suggested by Carter et al. in U.S. Patent Application Publication No. 20030153141 filed on Dec. 20, 2002 and entitled "Screen Printable Electrode for Light Emitting Polymer Device." In this application, Carter et al. describe a method for creating an air-stable electrode (cathode) for an LEP device. Unlike the LEP device with a non-air-stable electrode (cathode), the LEP device with an air-stable electrode (cathode) can be fabricated in an ambient environment and does not need to be maintained in an inert environment throughout fabrication and encapsulation. However, even with an air-stable electrode, moisture and air need to be removed from the device and the device needs to be encapsulated prior to operation because of irreversible electrochemical reactions that can occur in the device in the presence of moisture, air and electric fields.

Therefore, what is needed is a method for encapsulating a pre-fabricated, "off-the-shelf" LEP device having an air-stable electrode (cathode) such that undesirable moisture, air and residual solvents are removed prior to the encapsulation.

SUMMARY OF THE INVENTION

This invention provides a cost-effect manufacturing process for encapsulating an LEP device with an air-stable electrode (cathode) between two flexible sheet materials, where the first sheet may act as the substrate and the second sheet as a cover and at least one of the sheets is transparent. Both encapsulating sheets and, as required, an adhesive system binding the sheets together, should provide sufficient environmental barriers with low moisture vapor transmission rates (MVTR) and oxygen transmission rates (OTR) for LEP device long life operation. The encapsulating sheets may be selected from commercially available materials in sheet or roll form. The transparent encapsulating sheet may be comprised of the materials as described in the above referenced U.S. Pat. Nos. 6,268,695, 6,146,225 and 5,734,225. The second sheet need not be transparent, and may be comprised of polymer and metalization layers. The encapsulating sheets can, for example, be laminated together, sandwiching the LEP device in a vacuum, or oxygen free, inert gas environment.

Prior to the laminating step the LEP device may be heated and placed in a vacuum to remove moisture, air and solvents. The process may also be designed for roll to roll, sometimes called web based processing, where the LEP device and/or encapsulating sheet material are in a continuous roll format with an adhesive with low air permittivity, such as some UV or thermal curable epoxies, or a melt lamination process used to attach the encapsulating sheets. For LEP device with short lifetime requirements, the encapsulating material may be in liquid form and applied by spraying, dipping, doctor balding, and the like, or printing, such as screen printing, roller coating or lithographic application in single or multiple layers. Such material may also contain desiccants to further remove water and/or oxygen.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the known components referred to herein by way of illustration.

The LEP device having an air-stable electrode (cathode) according to an embodiment of the present invention may be fabricated in an ambient air (i.e., atmospheric) environment. Thus, the various layers of the LEP device, including the light emitting polymer layer, can absorb moisture (e.g., water vapor and oxygen) during the fabrication process, as well as after the fabrication process, while awaiting encapsulation. Typically, the absorbed water vapor and oxygen, if not removed prior to encapsulation, produces early life failure modes. To achieve a lifetime greater than a few minutes or hours using ambient air fabrication techniques that produce the air-stable electrode (cathode), the LEP device must have the oxygen and moisture, as well as any residual solvents remaining from the fabrication process, removed.

Figure 1A:
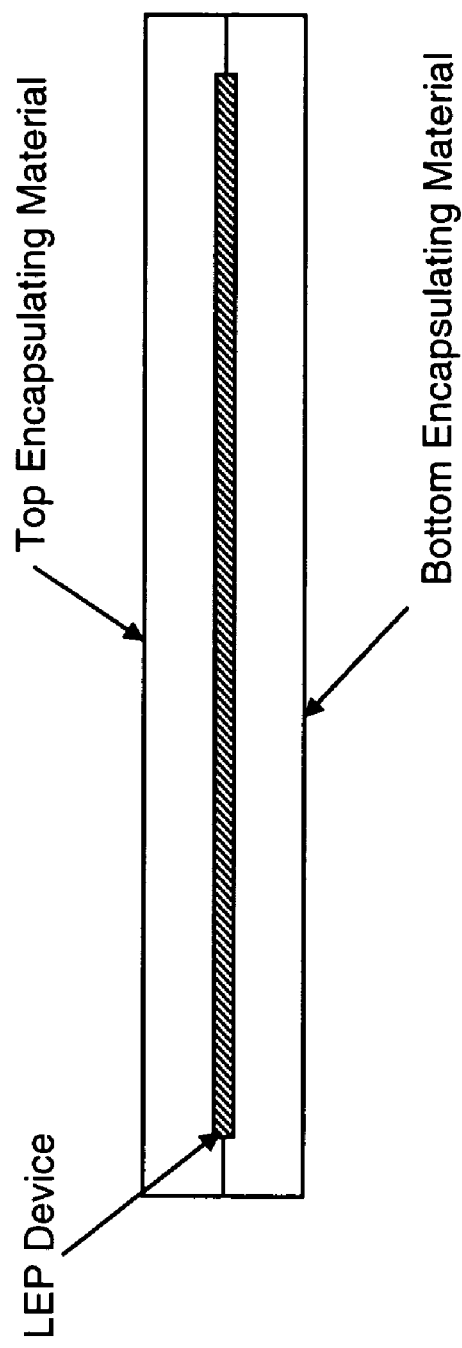
FIGS. 1A-1C illustrate an encapsulated LEP device having an air-stable electrode (cathode) according to an embodiment of the present invention.
Figure 1B:
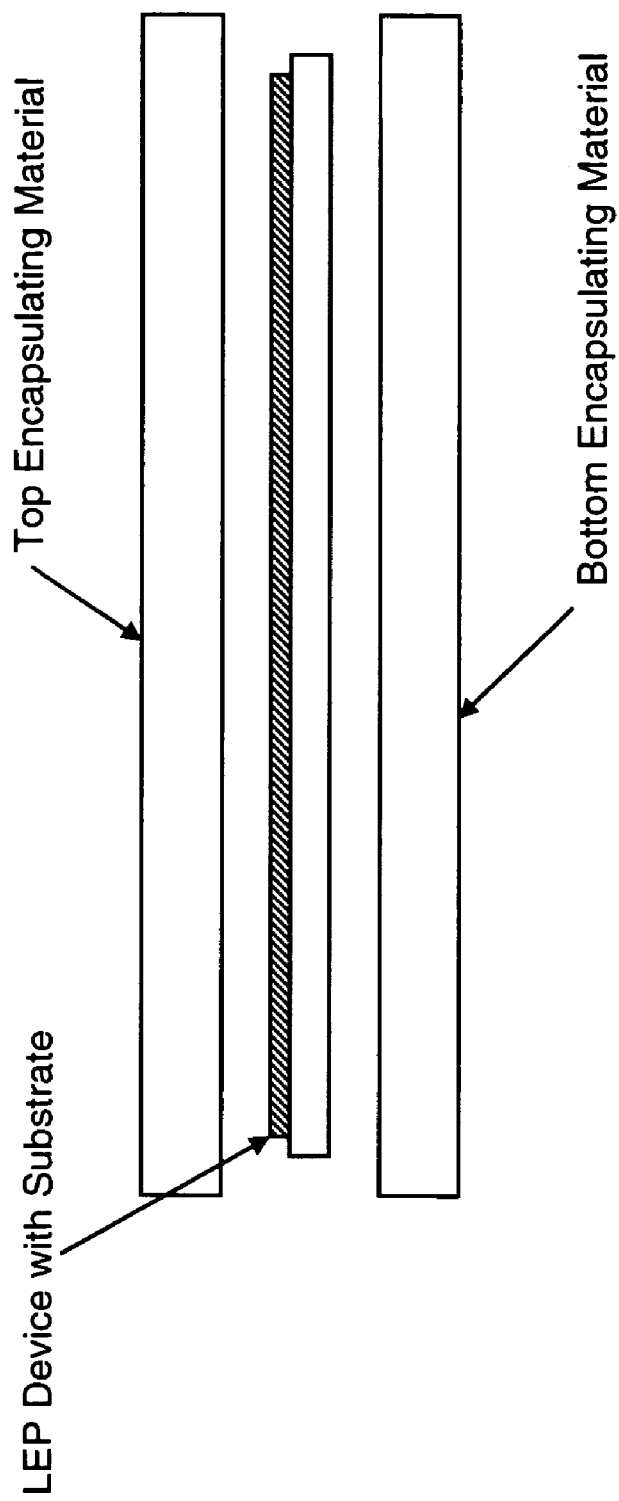
Figure 1C:
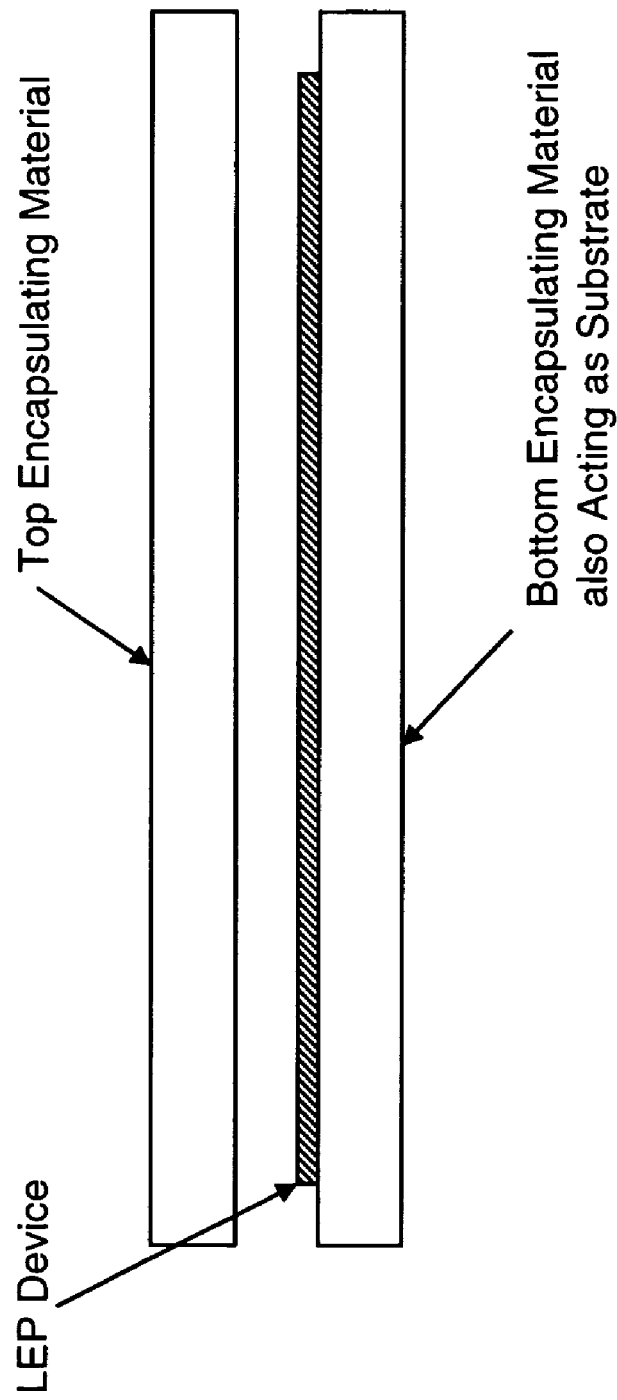

FIGS. 1A-1C illustrate an encapsulated LEP device having an air-stable electrode (cathode) according to an embodiment of the present invention. As shown in FIG. 1A, the LEP device may be encased between a top encapsulating material and a bottom encapsulating material. The LEP device, for example, includes air-stable electrodes (cathode) that are fabricated using ambient air fabrication techniques. In FIG. 1B, in addition to the top and bottom encapsulating materials, an LEP device having a substrate is shown. In this embodiment, the LEP device with its substrate may be encased by the top and bottom encapsulating materials. FIG. 1C shows the bottom encapsulating material also acting as the substrate for the LEP device. In this way, the substrate (i.e., bottom encapsulating material) and the top encapsulating material may encase the LEP device.

Figure 2:
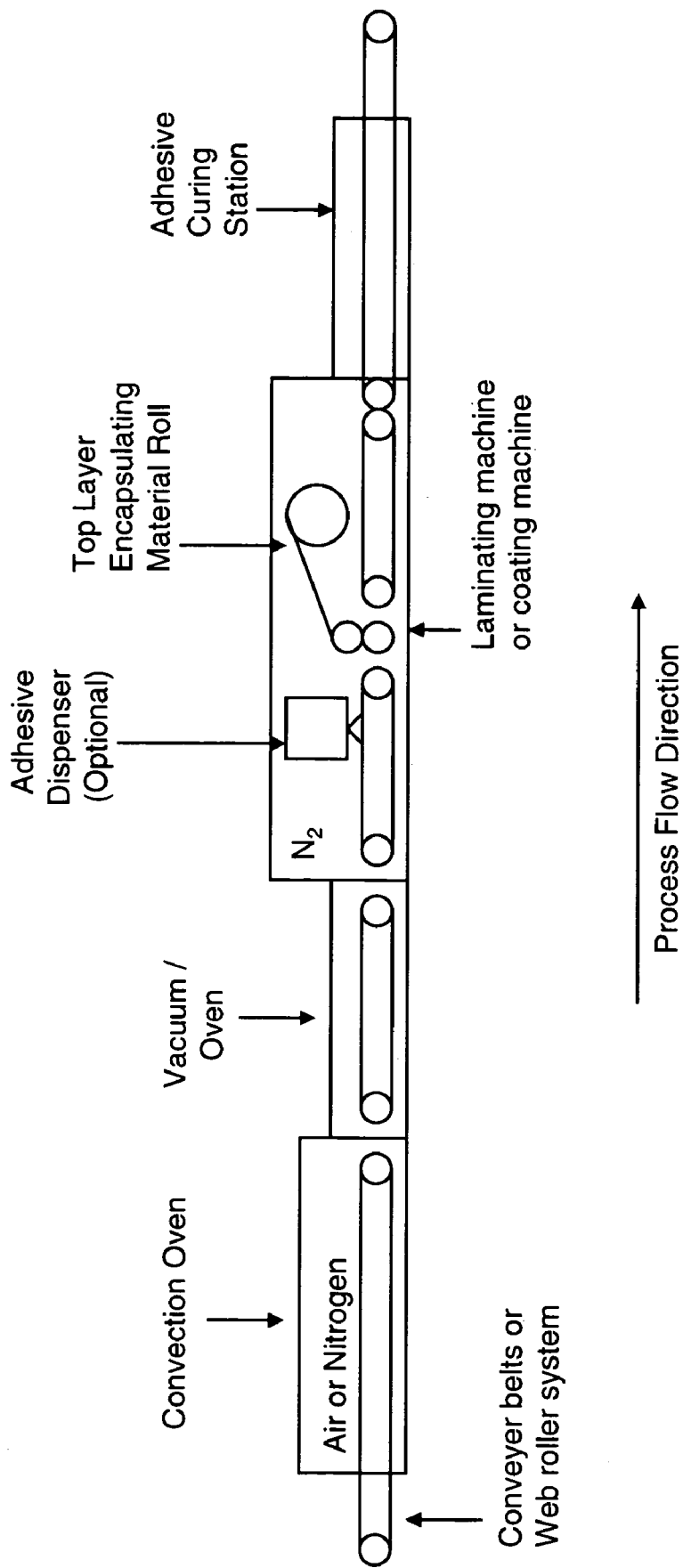
FIG. 2 illustrates a process for encapsulating an LEP device having an air-stable electrode (cathode) according to an embodiment of the present invention.

FIG. 2 illustrates a process for encapsulating an LEP device having an air-stable electrode (cathode) according to an embodiment of the present invention. As shown in FIG. 2, to achieve the removal of moisture and residual solvents remaining from the ambient air fabrication and subsequent storage of the LEP device, a pre-bake step is performed in, for example, a convection oven (as shown). The LEP device is placed in the convection oven up to a certain temperature for a sufficient period. The time and temperature should provide rapid burn-off of moisture and residual solvents, yet not cause damage to the LEP device (i.e., without causing deformation, melting of the plastic substrate, etc.). The pre-bake oven may have an air environment or an inert gas (such as nitrogen) environment, such as ovens commonly used for soldering components to printed circuit broads. The pre-bake oven may use convection heating (as shown) with multiple zones for precise temperature control and temperature profile management. The pre-bake oven may be manually controlled, automatically controlled, computer controlled or a combination of these control mechanisms. In one example of the pre-bake step, the LEP device is heated to a temperature at or above approximately 50 degrees Celsius and less than the melting temperature of the LEP device plastic substrate or the decomposition temperature of the light emitting polymer itself, which may theoretically be as high as approximately 200 degrees Celsius, but with a practical maximum of between approximately 120 and 140 degrees Celsius.

As shown in FIG. 2, the next step involves, for example, a vacuum/oven combination. To remove air (i.e., oxygen) and any remaining residual solvents or moisture, the LEP device may be moved directly from the pre-bake oven into a vacuum chamber for outgassing. The vacuum chamber, for example, may be set to approximately $10^{-4}$ Torr to approximately $10^{-7}$ Torr and maintained for approximately 30 seconds up to approximately 30 minutes. The vacuum chamber may be at room temperate or at an elevated temperature, for example, at an elevated temperature at or above approximately 50 degrees Celsius and less than the melting temperature of the plastic substrate or the decomposition temperature of the light emitting polymer. As will be evident to those skilled in the art, the vacuum chamber with heating capabilities may be used for both the pre-bake step as well as the vacuum/oven step.

According to this embodiment, the LEP device is next moved into an inert gas environment, such as nitrogen, where the LEP device may be sealed (e.g., laminated, printed, coated, etc.) with the encapsulation material(s). The encapsulation material may, for example, come in liquid, gel, sheet or roll format. For LEP devices with very short lifetime requirements, liquid encapsulation may be used and the material may be applied by one of many well known means to deposit liquid materials such as spraying, screen printing, doctor blading, or roller coating (i.e., lithography). For LEP devices requiring longer lifetimes, sheet or roll encapsulating material with low oxygen transmission rates (OTRs) and moisture vapor transmission rates (MVTRs) of between approximately $10^{-3}$ grams per square meter per 24 hours (gm/m$^2$/24 hrs) to approximately $10^{-5}$ gm/m$^2$/24 hrs may be used. In this long-life case, the roll laminating machine may consist of rollers using pressure and adhesive or heat to laminate the two encapsulating sheets together. FIG. 2 illustrates this aspect of this embodiment of the laminating/coating machine.

If an adhesive is used to bind the encapsulating sheets together, it may also have an equally sufficiently low MVTR and OTR in the cured state. Adhesives may, for example, be epoxy-based and UV-cured or heat-cured type. The adhesive may provide excellent adhesion the various printed layers of the LEP device, such as, for example, PolyEthylene Terephthalate (PET) and Indium Tin Oxide (ITO). The adhesive may also be compliant and conformable to allow flexing and bending of the LEP device, and not become brittle after curing, to avoid cracking during handling or die cutting. The adhesive may be cured in an adhesive curing station.

Figure 3:
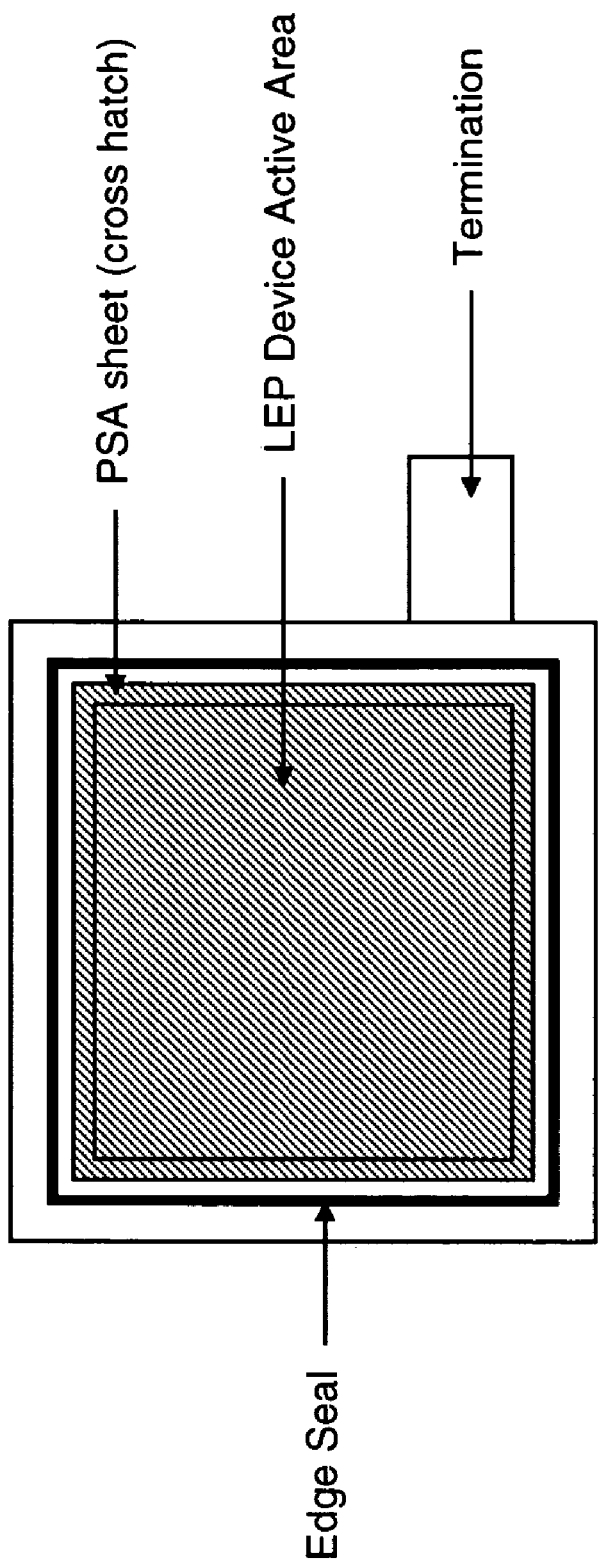
FIG. 3 illustrates an LEP device encapsulated using a pressure sensitive adhesive (PSA) sheet according to an embodiment of the present invention.

FIG. 3 illustrates another embodiment of the present invention, which entails using a pressure sensitive adhesive (PSA) sheet, such as, for example, an acrylic based sheet adhesive, to laminate the encapsulating sheets together over the entire LEP device area. The entire device can then be edge sealed, for example, either by heat sealing or using liquid adhesive applied to the circumference of the LEP device area. Terminations from the LEP device may be brought outside of the PSA sheet and edge seal.

Although the present invention has been particularly described with reference to the preferred embodiments thereof, it should be readily apparent to those of ordinary skill in the art that changes and modifications in the form and details thereof may be made without departing from the spirit and scope of the invention. For example, those skilled in the art will understand that variations can be made in the number and arrangement of components illustrated in the above block diagrams. It is intended that the appended claims include such changes and modifications.

What is claimed is:

1. A method for encapsulating a light emitting polymer (LEP) device having an air-stable electrode (cathode), the method comprising the steps of:
   obtaining the LEP device from an ambient environment;
   heating the LEP device to a temperature that substantially removes surface moisture and residual solvents from at least one surface of the LEP device;
   outgassing the LEP device; and
   laminating the at least one surface of the LEP device with encapsulating material, the encapsulating material providing the at least one surface of the LEP device with a barrier from an operational environment, wherein:
   the step of laminating comprises the steps of:
      positioning the LEP device in an inert environment;
      applying a top pressure sensitive adhesive sheet onto a top side of the LEP device;
      rolling a top encapsulating material onto the top side of the LEP device;
      sealing the top pressure sensitive adhesive sheet to the LEP device and the top
      encapsulating material so that the top encapsulating material forms the barrier;
      and wherein:
   the step of applying includes applying a bottom pressure sensitive adhesive sheet to a bottom side of the LEP device;
   the step of rolling includes rolling a bottom encapsulating material onto the bottom side of the LEP device; and
   the step of sealing includes:
      sealing the bottom pressure sensitive adhesive sheet to the LEP device and the bottom encapsulating material; and
      sealing the top encapsulating material to the bottom encapsulating material around an outside perimeter of the LEP device.

2. The method according to claim 1 wherein the step of laminating comprises the steps of:
   positioning the LEP device in an inert environment;
   applying an adhesive to a top side of the LEP device;
   rolling a top encapsulating material onto the top side of the LEP device; and
   curing the adhesive so that the top encapsulating material forms the barrier.

3. The method according to claim 2 wherein:
   the step of applying includes applying the adhesive to a bottom side of the LEP device; and
   the step of rolling includes rolling a bottom encapsulating material onto the bottom side of the LEP device.

4. The method according to claim 3 wherein the step of positioning is performed after the steps of heating and outgassing are complete and is performed with substantially no exposure of the LEP device to the ambient environment.

5. The method according to claim 3 wherein the steps of applying, rolling and curing are performed while the LEP device is subjected to a reduced pressure.

6. The method according to claim 3 wherein the adhesive is an epoxy-based adhesive.

7. The method according to claim 3 wherein each of the top and bottom encapsulating materials has a moisture vapor transmission rate (MVTR) of between approximately $10^{-3}$ grams per square meter per 24 hours ($gm/m^2/24$ hrs) to approximately $10^{-5}$ $gm/m^2/24$ hrs.

8. The method according to claim 3 wherein each of the top and bottom encapsulating materials has an oxygen transmission rate (OTR) of between approximately $10^{-3}$ grams per square meter per 24 hours ($gm/m^2/24$ hrs) to approximately $10^{-5}$ $gm/m^2/24$ hrs.

9. The method according to claim 2 wherein the adhesive is an epoxy-based adhesive.

10. The method according to claim 9 wherein the epoxy-based adhesive is heat-cured.

11. The method according to claim 9 wherein the epoxy-base adhesive is ultraviolet-cured.

12. The method according to claim 2 wherein the top encapsulating material has a moisture vapor transmission rate (MVTR) of between approximately $10^-$grams per square meter per 24 hours ($gm/m^2/24$ hrs) to approximately $10^{-5} gm/m^2/24$ hrs.

13. The method according to claim 2 wherein the steps of applying, rolling and curing are performed while the LEP device is subjected to a reduced pressure.

14. The method according to claim 2 wherein the step of positioning is performed after the steps of heating and outgassing are complete and is performed with substantially no exposure of the LEP device to the ambient environment.

15. The method according to claim 2 wherein the top encapsulating material has an oxygen transmission rate (OTR) of between approximately $10^{-3}$ grams per square meter per 24 hours ($gm/m^2/24$ hrs) to approximately $10^{-5}$ $gm/m^2/24$ hrs.

16. The method according to claim 1 wherein the step of outgassing is performed at a reduced pressure and for a period of time.

17. The method according to claim 16 wherein the reduced pressure is between approximately $10^{-4}$ Torr and approximately $10^{-7}$ Torr.

18. The method according to claim 17 wherein the period of time is greater than or equal to approximately 30 seconds and less than or equal to approximately 30 minutes.

19. The method according to claim 16 wherein the steps of heating and outgassing are performed substantially simultaneously.

20. The method according to claim 19 wherein:
   the temperature is greater than or equal to approximately 50 degrees Celsius and less than approximately 200 degrees Celsius;
   the reduced pressure is between approximately $10^{-4}$ Torr and approximately $10^{-7}$ Torr; and the period of time is greater than or equal to approximately 30 seconds and less than or equal to approximately 30 minutes.

21. The method according to claim 1 wherein the step of heating is performed in an ambient air environment.

22. The method according to claim 1 wherein the step of positioning is performed after the steps of heating and outgassing are complete and is performed with substantially no exposure of the LEP device to the ambient environment.

23. The method according to claim 1 wherein the steps of applying and rolling are performed while the LEP device is subjected to a reduced pressure.

24. The method according to claim 1 wherein the step of laminating comprises the steps of:
positioning the LEP device in an inert environment;
applying a liquid encapsulating material onto the at least one surface of the LEP device while in the inert environment; and
curing the liquid encapsulating material to form the barrier.

25. The method according to claim 24 wherein the step of positioning is performed after the steps of heating and outgassing are complete and is performed with substantially no exposure of the LEP device to the ambient environment.

26. The method according to claim 25 wherein the step of applying includes one or more of spraying, screen printing, doctor blading and roller coating.

27. The method according to claim 1 wherein the temperature is greater than or equal to approximately 50 degrees Celsius and less than approximately 200 degrees Celsius.

28. The method according to claim 27 wherein the temperature is less than approximately 140 degrees Celsius.

29. The method according to claim 27 wherein the temperature is less than approximately 120 degrees Celsius.

30. The method according to claim 1 wherein the step of heating is performed in an inert gas environment.

31. The method according to claim 30 wherein the inert gas environment is a nitrogen gas environment.

32. The method according to claim 1 wherein the top encapsulating material has a moisture vapor transmission rate (MVTR) of between approximately $10^{-3}$ grams per square meter per 24 hours ($gm/m^2/24$ hrs) to approximately $10^{-5}$ $gm/m^2/24$ hrs.

33. The process according to claim 1 wherein sealing the top encapsulating material to the bottom encapsulating material includes using heat bonding.

34. The process according to claim 1 wherein sealing the top encapsulating material to the bottom encapsulating material includes using an ultraviolet curable adhesive.

35. The method according to claim 1 wherein the top encapsulating material has an oxygen transmission rate (OTR) of between approximately $10^{-3}$ grams per square meter per 24 hours ($gm/m^2/24$ hrs) to approximately $10^{-5}$ $gm/m^2/24$ hrs.

36. The method according to claim 1 wherein each of the top and bottom encapsulating materials has an oxygen transmission rate (OTR) of between approximately $10^{-3}$ grams per square meter per 24 hours ($gm/m^2/24$ hrs) to approximately $10^{-5}$ $gm/m^2/24$ hrs.

* * * * *